United States Patent
Zhou et al.

[11] Patent Number: 6,057,240
[45] Date of Patent: May 2, 2000

[54] AQUEOUS SURFACTANT SOLUTION METHOD FOR STRIPPING METAL PLASMA ETCH DEPOSITED OXIDIZED METAL IMPREGNATED POLYMER RESIDUE LAYERS FROM PATTERNED METAL LAYERS

[75] Inventors: Mei-Sheng Zhou; Jian-Hui Ye; Simon Chooi; Young-Tong Tsai, all of Singapore, Singapore

[73] Assignee: Chartered Semiconductor Manufacturing, Ltd., Singapore, Singapore

[21] Appl. No.: 09/055,437

[22] Filed: Apr. 6, 1998

[51] Int. Cl.[7] .............................. H01R 13/502; C11D 9/00
[52] U.S. Cl. ..................... 438/689; 438/735; 510/175; 510/176; 510/178; 510/255; 510/259; 510/435; 510/504; 252/1.3; 252/2; 106/14.15; 106/14.42
[58] Field of Search ...................................... 510/175, 176, 510/178, 255, 259, 435, 504; 252/79.1, 79.5, 394; 134/1.3, 2; 106/14.15, 14.42; 438/689, 735

[56] References Cited

U.S. PATENT DOCUMENTS

| | | | |
|---|---|---|---|
| 4,592,800 | 6/1986 | Landau et al. | 156/643 |
| 5,091,103 | 2/1992 | Dean et al. | 252/162 |
| 5,312,776 | 5/1994 | Murakami et al. | 437/194 |
| 5,466,389 | 11/1995 | Ilardi et al. | 252/156 |
| 5,514,478 | 5/1996 | Nadkarni | 438/469 |
| 5,538,921 | 7/1996 | Obeng | 437/190 |
| 5,569,628 | 10/1996 | Yano et al. | 437/245 |
| 5,648,324 | 7/1997 | Honda et al. | 510/176 |
| 5,665,688 | 9/1997 | Honda et al. | 510/178 |
| 5,780,406 | 7/1998 | Honda et al. | 510/175 |
| 5,798,323 | 8/1998 | Honda et al. | 510/176 |
| 5,817,610 | 10/1998 | Honda et al. | 510/176 |

*Primary Examiner*—Samuel A. Acquah
*Attorney, Agent, or Firm*—George O. Saile; Rosemary L. S. Pike; Alek P. Szecsy

[57] ABSTRACT

A method for forming a patterned metal layer within a microelectronics fabrication. There is first provided a substrate employed within a microelectronics fabrication. There is then formed over the substrate a blanket metal layer. There is then formed over the blanket metal layer a patterned photoresist layer. There is then etched through use of a plasma etch method while employing the patterned photoresist layer as a photoresist etch mask layer the blanket metal layer to form a patterned metal layer. The patterned metal layer so formed has a metal impregnated carbonaceous polymer residue layer formed upon a sidewall of the patterned metal layer. There is then stripped from the patterned metal layer the patterned photoresist layer through use of an oxygen containing plasma while simultaneously oxidizing the metal impregnated carbonaceous polymer residue layer to form an oxidized metal impregnated polymer residue layer upon the sidewall of the patterned metal layer. There is then stripped from the sidewall of the patterned metal layer the oxidized metal impregnated polymer residue layer while employing an aqueous alkyl ammonium hydroxide based solution. The aqueous alkyl ammonium hydroxide based solution has incorporated therein a surfactant capable of forming a monolayer adsorbed upon the sidewall of the patterned metal layer.

15 Claims, 3 Drawing Sheets

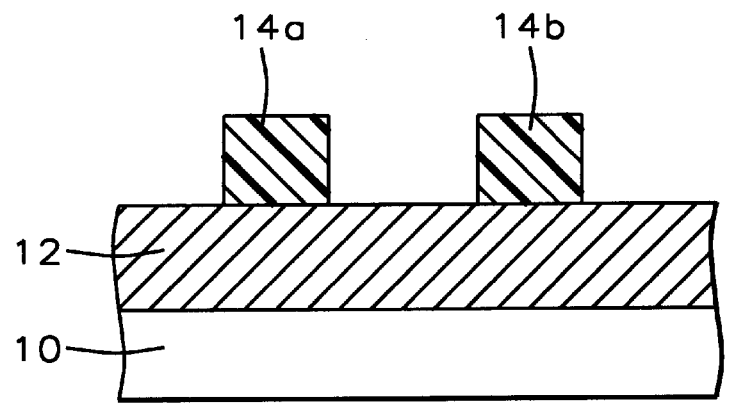
FIG. 1 – Prior Art
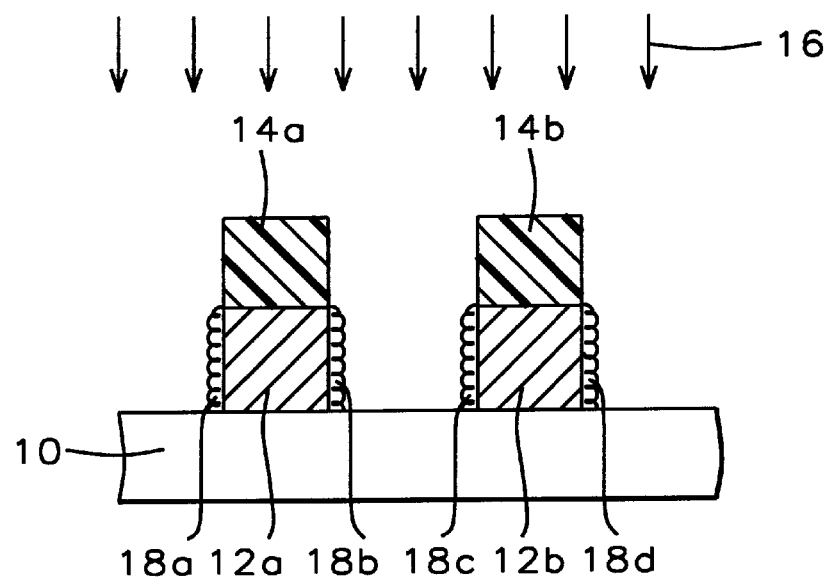
FIG. 2 – Prior Art
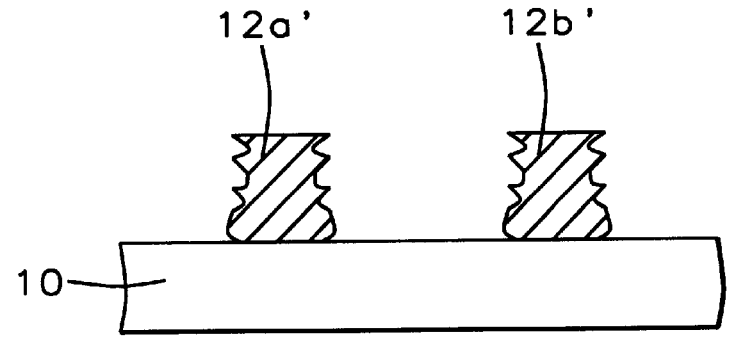
FIG. 3 – Prior Art

AQUEOUS SURFACTANT SOLUTION METHOD FOR STRIPPING METAL PLASMA ETCH DEPOSITED OXIDIZED METAL IMPREGNATED POLYMER RESIDUE LAYERS FROM PATTERNED METAL LAYERS

BACKGROUND OF THE INVENTION

1. Field of the Invention

The present invention relates generally to photolithographic and plasma etch methods for forming patterned metal layers within microelectronics fabrications. More particularly, the present invention relates to wet chemical stripping methods employed within photolithographic and plasma etch methods for forming patterned metal layers within microelectronics fabrications.

2. Description of the Related Art

Microelectronics fabrications are formed from microelectronics substrates upon which are formed patterned microelectronics conductor layers which are separated by microelectronics dielectric layers.

As microelectronics fabrication functionality and integration levels have increased, it has become increasingly more important within the art of microelectronics fabrication to form uniform and reliable patterned microelectronics conductor layers of increasingly narrower linewidth dimensions. While patterned microelectronics conductor layers are thus desirably formed of increasingly narrower linewidth dimensions within advanced microelectronics fabrications to provide advanced microelectronics fabrications of enhanced performance, patterned microelectronics conductor layers with increasingly narrower linewidth dimensions are not formed entirely without problems within advanced microelectronics fabrications.

For example, it is known in the art of advanced microelectronics fabrication that patterned microelectronics conductor layers when formed as patterned microelectronics conductor metal layers through plasma etch methods as are common in the art of advanced microelectronics fabrication often have metal impregnated carbonaceous polymer residue layers formed upon their sidewalls incident to the plasma etch methods. The metal impregnated carbonaceous polymer residue layers typically derive from metal obtained from a blanket microelectronics conductor metal layer from which is formed the patterned microelectronics conductor metal layers through the plasma etch method, along with carbon based polymer materials derived from either: (1) a carbon containing etchant gas composition employed within the plasma etch method; or (2) a slight etching of a series of patterned photoresist layers which is employed in defining the patterned microelectronics conductor metal layers through use of the plasma etch method. Upon stripping from the patterned microelectronics conductor metal layer sidewalls oxygen containing photoresist stripping plasma oxidized metal impregnated polymer residue layers formed from the metal impregnated carbonaceous polymer residue layers while employing an aqueous alkyl ammonium hydroxide based photoresist developer solution such as but not limited to an aqueous tetramethyl ammonium hydroxide (TMAH) based photoresist developer solution or an aqueous trimethyl (2-hydroxyethyl) ammonium hydroxide (ie: choline) based photoresist developer solution there is often corroded or eroded at least the sidewalls of the patterned microelectronics conductor metal layer. A series of schematic cross-sectional diagrams illustrating the results of forming within a microelectronics fabrication a pair of such corroded or eroded patterned microelectronics conductor metal layers is shown in FIG. 1 to FIG. 3.

Shown in FIG. 1 is a substrate 10 employed within a microelectronics fabrication, where the substrate 10 has a blanket conductor metal layer 12 formed thereover. In turn, the blanket conductor metal layer 12 has formed thereupon a pair of patterned photoresist layers 14a and 14b. As is illustrated in FIG. 2, when the blanket conductor metal layer 12 is etched to form a pair of patterned conductor metal layers 12a and 12b through use of a metal etching plasma 16 while simultaneously employing the pair of patterned photoresist layers 14a and 14b as a photoresist etch mask layer, there is formed upon the sidewalls of the patterned conductor metal layers 12a and 12b a series of metal impregnated carbonaceous polymer residue layers 18a, 18b, 18c and 18d.

As shown in FIG. 3, upon stripping from the microelectronics fabrication whose schematic cross-sectional diagram is illustrated in FIG. 2: (1) the patterned photoresist layers 14a and 14b (through use of an oxygen containing plasma stripping method sequential and subsequent to a metal etching plasma method employing the metal etching plasma 16); and (2) a series of oxygen containing stripping plasma oxidized metal impregnated polymer residue layers formed from the series of metal impregnated carbonaceous polymer residue layers 18a, 18b, 18c and 18d (through use of an aqueous alkyl ammonium hydroxide based photoresist developer solution such as but not limited to an aqueous tetramethyl ammonium hydroxide (TMAH) based photoresist developer solution or an aqueous choline based photoresist developer solution), there is typically formed a pair of etched patterned conductor metal layers 12a' and 12b', which as illustrated in FIG. 3 are either corroded or eroded, from the patterned conductor metal layers 12a and 12b as illustrated in FIG. 2.

Etched patterned metal layers, such as the etched patterned conductor metal layers 12a' and 12b' as illustrated in FIG. 3, are undesirable within the art of microelectronics fabrication since it is often difficult to form fully functional or reliable microelectronics circuits within microelectronics fabrications having formed therein such etched patterned metal layers.

It is thus towards the goal of forming within microelectronics fabrications patterned conductor metal layers through plasma etch methods and subsequently stripping from the sidewalls of the patterned conductor metal layers so formed oxidized metal impregnated polymer residue layers formed incident to the plasma etch methods, the oxidized metal impregnated polymer residue layers being stripped while employing aqueous alkyl ammonium hydroxide based solutions such as but not limited to aqueous tetramethyl ammonium hydroxide (TMAH) based photoresist developer solutions and aqueous choline based photoresist developer solutions, with attenuated corrosion or erosion of the patterned conductor metal layers, that the present invention is directed. Within the present invention corrosion and erosion of patterned metal layers are intended as analogous, and possibly related, physical deterioration phenomena experienced by patterned metal layers.

Various methods have been disclosed in the pertinent arts for attenuating corrosion and related metal layer deterioration phenomena encountered within metal layers, in particular aluminum containing metal layers, at least some of which may be formed within microelectronics fabrications.

For example, Landau et al., in U.S. Pat. No. 4,592,800, discloses a method for inhibiting corrosion of a patterned aluminum containing conductor metal layer formed through a plasma etch method within an integrated circuit microelectronics fabrication. The method employs displacing volatile corrosive species sorbed on or near the patterned aluminum containing conductor layer within the microelectronics fabrication incident to the plasma etch method with more readily sorbed non-corrosive volatile species of higher molecular weight.

In addition, Murakami et al., in U.S. Pat. No. 5,312,776 similarly also discloses a method for inhibiting corrosion of a patterned conductor metal layer, which may be a patterned aluminum containing conductor metal layer, formed through a plasma etch method within an integrated circuit microelectronics fabrication. The method employs forming a hydrophobic molecular layer, while employing a material such as hexamethyldisilazane (HMDS), upon at least the exposed lateral surfaces of the patterned conductor metal layer.

Further, Nadkarni, in U.S. Pat. No. 5,514,478, discloses a non-abrasive and corrosion resistant hydrophilic coating for an aluminum substrate, along with its method of application upon the aluminum substrate. The coating contains effective minor amounts of nitrilotrismethylenetriphosphonic acid, phosphoric acid, a borate material and a polyacrylic acid, without silica or alumina type materials, which when thermally cured upon an aluminum substrate provides a hydrophilic coating exhibiting a stable water contact angle of no greater than about 15 degrees.

Yet further, Obeng in U.S. Pat. No. 5,538,921, also discloses a method for attenuating corrosion of a patterned conductor metal layer, such as a patterned aluminum containing conductor metal layer, formed through a plasma etch method within an integrated circuit microelectronics fabrication. The method employs rinsing the integrated circuit having the patterned conductor metal layer formed therein with an aqueous solution of a non-ionic or an ampholytic surfactant.

Finally, Yano et al., in U.S. Pat. No. 5,569,628, discloses several methods for attenuating corrosion related problems, such as interdiffusion, when forming patterned metal layers, such as patterned aluminum containing conductor layers, upon substrates within integrated circuit microelectronics fabrications. The methods employ forming a molecular film of a silicon material upon a substrate layer employed within an integrated circuit microelectronics fabrication, where a metal layer when subsequently formed upon the molecular film reacts with the molecular film and forms a metal layer deposited upon only the molecular layer and not interdiffused with the substrate layer.

Desirable within the art of microelectronics fabrication are methods through which there may be stripped from the sidewalls of patterned conductor metal layers formed employing plasma etch methods within microelectronics fabrications oxidized metal impregnated polymer residue layers formed incident to the plasma etch methods, the oxidized metal impregnated polymer residue layers being stripped through use of aqueous alkyl ammonium hydroxide based solutions such as but not limited to aqueous tetramethyl ammonium hydroxide (TMAH) based photoresist developer solutions and aqueous choline based photoresist developer solutions, with attenuated corrosion or erosion of the patterned conductor metal layers. It is towards that goal that the present invention is directed.

SUMMARY OF THE INVENTION

A first object of the present invention is to provide a method through which there may be stripped from a sidewall of a patterned metal layer formed through plasma etch method within a microelectronics fabrication an oxidized metal impregnated polymer residue layer formed incident to the plasma etch method, the oxidized metal impregnated polymer residue layer being stripped while employing an aqueous alkyl ammonium hydroxide based solution such as but not limited to an aqueous tetramethyl ammonium hydroxide (TMAH) based photoresist developer solution or an aqueous choline based photoresist developer solution.

A second object of the present invention is to provide a method in accord with the first object of the present invention, where the oxidized metal impregnated polymer residue layer is stripped with attenuated corrosion or erosion of the patterned metal layer.

A third object of the present invention is to provide a method in accord with the first object of the present invention or the second object of the present invention, which method is readily commercially implemented.

In accord with the objects of the present invention, there is provided a method for forming a patterned metal layer within a microelectronics fabrication. To practice the method of the present invention, there is first provided a substrate employed within a microelectronics fabrication. There is then formed over the substrate a blanket metal layer. There is then formed over the blanket metal layer a patterned photoresist layer. There is then etched through use of a plasma etch method while employing the patterned photoresist layer as a photoresist etch mask layer the blanket metal layer to form a patterned metal layer. The patterned metal layer so formed has a metal impregnated carbonaceous polymer residue layer formed upon a sidewall of the patterned metal layer. There is then stripped from the patterned metal layer the patterned photoresist layer through use of an oxygen containing plasma while simultaneously oxidizing the metal impregnated carbonaceous polymer residue layer to form an oxidized metal impregnated polymer residue layer. Finally, there is then stripped from the sidewall of the patterned metal layer the oxidized metal impregnated polymer residue layer while employing an aqueous alkyl ammonium hydroxide solution. The aqueous alkyl ammonium hydroxide solution has incorporated therein a surfactant capable of forming an ordered monolayer adsorbed upon the sidewall of the patterned metal layer.

The present invention provides a method through which there may be stripped from a sidewall of a patterned conductor metal layer formed through a plasma etch method within a microelectronics fabrication an oxidized metal impregnated polymer residue layer, the oxidized metal impregnated polymer residue layer being stripped while employing an aqueous alkyl ammonium hydroxide based solution such as but not limited to an aqueous tetramethyl ammonium hydroxide (TMAH) based photoresist developer solution or an aqueous choline based photoresist developer solution, where the oxidized metal impregnated polymer residue layer is stripped with attenuated corrosion or erosion of the patterned metal layer. The method of the present invention realizes the foregoing objects by employing within the aqueous alkyl ammonium hydroxide based solution a surfactant which is capable of forming an ordered monolayer upon the sidewall of the patterned metal layer.

The method of the present invention is readily commercially implemented. The method of the present invention employs within an aqueous alkyl ammonium hydroxide based solution a surfactant which is capable of forming an ordered monolayer upon a sidewall of a patterned metal layer. Since novelty of the method of the present invention is predicated at least in part upon a unique combination of materials which are otherwise generally known, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 to FIG. 3 show a series of schematic cross-sectional diagrams illustrating the results of forming through use of a plasma etch method a pair of patterned conductor metal layers within a microelectronics fabrication, where when stripping from the sidewalls of the pair of patterned conductor metal layers a series of oxygen containing photoresist stripping plasma oxidized metal impregnated polymer residue layers formed incident to the plasma etch method through use of an alkyl ammonium hydroxide based solution conventional in the art of microelectronics fabrication there is corroded or eroded the pair of patterned conductor metal layers.

DESCRIPTION OF THE PREFERRED EMBODIMENT

The present invention provides a method through which there may be stripped from a sidewall of a patterned metal layer formed through a plasma etch method within a microelectronics fabrication an oxidized metal impregnated polymer residue layer, the oxidized metal impregnated polymer residue layer being stripped through use of an aqueous alkyl ammonium hydroxide based solution such as but not limited to an aqueous tetramethyl ammonium hydroxide (TMAH) based photoresist developer solution or an aqueous choline based photoresist developer solution, where the oxidized metal impregnated polymer residue layer is stripped with attenuated corrosion or erosion of the patterned metal layer. The method of the present invention realizes the foregoing objects by employing within the aqueous alkyl ammonium hydroxide based solution a surfactant which is capable of forming an ordered monolayer adsorbed upon the sidewall of the patterned conductor metal layer. The aqueous alkyl ammonium hydroxide based solution of the present invention having the surfactant incorporated therein attenuates corrosion or erosion of the patterned metal layer in comparison with an otherwise equivalent aqueous alkyl ammonium hydroxide based solution absent the surfactant of the present invention.

The method of the present invention may be employed in forming patterned metal layers within microelectronics fabrications including but not limited to integrated circuit microelectronics fabrications, solar cell microelectronics fabrications, ceramic substrate microelectronics fabrications and flat panel display microelectronics fabrications.

Figure 4:
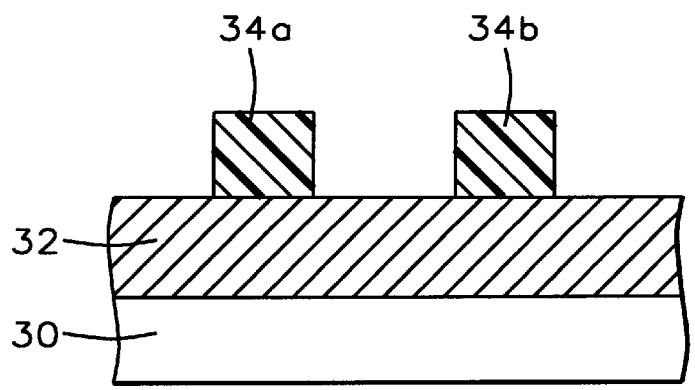
FIG. 4 to FIG. 7 show a series of schematic cross-sectional diagrams illustrating the results of forming through use of a plasma etch method a pair of patterned metal layers within a microelectronics fabrication in accord with a preferred embodiment of the present invention, where when stripping from the sidewalls of the pair of patterned metal layers a series of oxygen containing photoresist stripping plasma oxidized metal impregnated polymer residue layers through use of an alkyl ammonium hydroxide based solution in accord with the preferred embodiment of the present invention there is attenuated corrosion or erosion of the pair of patterned metal layers.

Referring now to FIG. 4 to FIG. 7, there is shown a series of schematic cross-sectional diagrams illustrating the results of forming within a microelectronics in accord with a preferred embodiment of the present invention a pair of patterned metal layers through a plasma etch method, where when stripping from the sidewalls of the pair of patterned metal layers through use of an aqueous alkyl ammonium hydroxide based solution in accord with the preferred embodiment of the method of the present invention a series of oxidized metal impregnated polymer residue layer formed incident to the plasma etch method, there is attenuated corrosion or erosion of the patterned metal layers. Shown in FIG. 4 is a schematic cross-sectional diagram of the microelectronics fabrication at an early stage in practice of the method of the present invention.

Shown in FIG. 4 is a substrate 30 having formed thereover a blanket metal layer 32 which in turn has formed thereupon a pair of patterned photoresist layers 34a and 34b. Within the preferred embodiment of the present invention, the substrate 30 may be a substrate employed within a microelectronics fabrication selected from the group of microelectronics fabrications including but not limited to integrated circuit microelectronics fabrications, solar cell microelectronics fabrications, ceramic substrate microelectronics fabrications and flat panel display microelectronics fabrications.

Although not specifically illustrated within FIG. 4, the substrate 30 may be the substrate itself employed within the microelectronics fabrication, or in the alternative, the substrate 30 may also be the substrate employed within the microelectronics fabrication, where the substrate in turn has formed thereover or thereupon any of several additional microelectronics layers which are typically employed within the microelectronics fabrication. Such additional microelectronics layers may include, but are not limited to, microelectronics conductor layers, microelectronics semiconductor layers and microelectronics dielectric layers. Similarly, as is also not specifically illustrated within the schematic cross-sectional diagram of FIG. 4, the substrate 30 (particularly when the substrate 30 is a semiconductor substrate employed within an integrated circuit microelectronics fabrication) may have formed therein and/or thereupon any of several microelectronics devices as are typical of the microelectronics fabrication within which is employed the substrate 30. Such microelectronics devices may include, but are not limited to transistors, resistors, capacitors and diodes.

With respect to the blanket metal layer 32, the blanket metal layer 32 is formed of a metal which is susceptible to corrosion or erosion within an alkyl ammonium hydroxide based solution, such as but not limited to a tetramethyl ammonium hydroxide (TMAH) based photoresist developer solution or a choline based photoresist developer solution typically employed in developing the patterned photoresist layers 34a and 34b from a corresponding blanket photoresist layer. Such metals may include, but are not limited to, aluminum and aluminum alloys. As is common in the art of microelectronics fabrication, the blanket metal layer 32 may also incorporate barrier metal layers and/or barrier material layers beneath and/or above a blanket conductor metal layer within the blanket metal layer 32. Such barrier metal layers and barrier material layers include, but are not limited to, titanium metal layers, titanium-tungsten alloy layers and titanium nitride layers.

For the preferred embodiment of the present invention, the blanket metal layer 32 is preferably formed as a blanket metal layer 32 stack comprising: (1) a blanket titanium barrier metal layer of thickness from about 50 to about 1000 angstroms formed most closely adjoining the substrate 30 (this layer is preferably employed only when the blanket metal layer 32 is formed upon a silicon layer or a silicon substrate such as but not limited to a monocrystalline silicon layer or substrate or a polycrystalline silicon layer or substrate); (2) a blanket lower titanium nitride barrier material layer of thickness about 100 to about 2000 angstroms formed upon the blanket titanium barrier metal layer, if present; (3) a blanket aluminum-silicon-copper alloy conductor metal layer of composition from about 99.8:0:0.2 to about 94:2:4 (w:w:w) and of thickness about 1000 to about 10000 angstroms formed upon the blanket lower titanium nitride barrier material layer; and (4) a blanket upper titanium nitride barrier material layer of thickness from about 100 to about 2000 angstroms formed upon the blanket aluminum:silicon:copper alloy conductor metal layer. Each of the foregoing layers may be formed through methods and materials as are conventional in the art of microelectronics fabrication, including but not limited to chemical vapor deposition (CVD) methods and physical vapor deposition (PVD) methods, while employing source materials as are appropriate to the individual methods and layers.

Finally, with respect to the patterned photoresist layers 34a and 34b, the patterned photoresist layers 34a and 34b may be formed from any of several photoresist materials as are known in the art of microelectronics fabrication, where such photoresist materials may be selected from the general group of photoresist materials including but not limited to positive photoresist materials and negative photoresist materials. Preferably, the patterned photoresist layers 34a and 34b are each formed to a thickness of from about 8000 to about 20000 angstroms upon the blanket metal layer 32.

Figure 5:
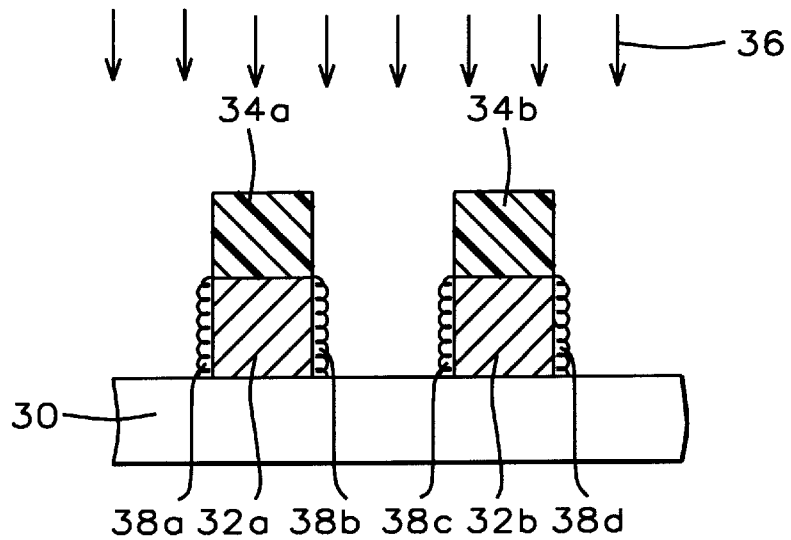

Referring now to FIG. 5, there is shown a schematic cross-sectional diagram illustrating the results of further processing of the microelectronics fabrication whose schematic cross-sectional diagram is illustrated in FIG. 4. Shown in FIG. 5 is a schematic cross-sectional diagram of a microelectronics fabrication otherwise equivalent to the microelectronics fabrication whose schematic cross-sectional diagram is illustrated in FIG. 4, but wherein the blanket conductor metal layer 32 has been patterned to form the patterned conductor metal layers 32a and 32b through use of a metal etching plasma 36 while employing the pair of patterned photoresist layers 34a and 34b as a photoresist etch mask layer. Within the method of the present invention, the metal etching plasma 36 is selected in accord with the composition of the layers formed within the blanket metal layer 32.

Within the preferred embodiment of the method of the present invention, where the blanket metal layer 32 is formed predominantly from an aluminum containing conductor material, the metal etching plasma 36 typically and preferably employs a chlorine containing etchant gas composition comprising a chlorine containing gas such as but not limited to chlorine, hydrogen chloride, boron trichloride, carbon tetrachloride and/or chloroform, along with suitable background carrier and/or stabilizing gases. More preferably, within the preferred embodiment of the present invention, the metal etching plasma 36 employs a chlorine containing etchant gas composition consisting of chlorine and boron trichloride, along with suitable background carrier and/or stabilizing gases.

Preferably, the metal etching plasma 36 also employs: (1) a reactor chamber pressure of from about 5 to about 50 mtorr; (2) a radio frequency power of from about 100 to about 2500 watts at a radio frequency of 13.56 MHz; (3) a substrate 30 temperature of from about 50 to about 300 degrees centigrade; (4) a chlorine flow rate of from about 5 to about 150 standard cubic centimeters per minute (sccm); (5) a boron trichloride flow rate of from about 5 to about 150 standard cubic centimeters per minute (sccm); and (6) a background helium or argon flow rate of from about 5 to about 200 standard cubic centimeters per minute (sccm), for a time period sufficient to completely etch the blanket metal layer 32 in forming the patterned metal layers 32a and 32b.

As is illustrated within the schematic cross-sectional diagram of FIG. 5, there is formed incident to the metal etching plasma 36 etch method through which is formed patterned metal layers 32a and 32b a series of metal impregnated carbonaceous polymer residue layers 38a, 38b, 38c and 38d upon the sidewalls of the patterned metal layers 32a and 32b. The metal impregnated carbonaceous polymer residue layers 38a, 38b, 38c and 38d are formed from metal derived from etching of the blanket conductor metal layer 32, along with carbon derived from at least either: (1) a carbon containing etchant gas within the chlorine containing etchant gas composition employed within the metal etching plasma 36, if such a carbon containing etchant gas is present; or (2) carbon derived from slight etching of the patterned photoresist layers 32a and 32b within the metal etching plasma 36. Typically, the metal impregnated carbonaceous polymer residue layers 38a, 38b, 38c and 38d are formed to a width of from about 100 to about 1000 angstroms each upon the sidewalls of the patterned conductor metal layers 32a and 32b.

Figure 6:
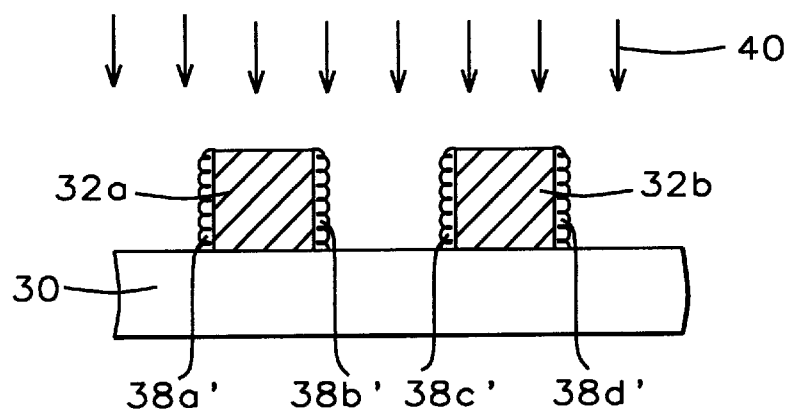

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein the patterned photoresist layers 34a and 34b have been stripped from the microelectronics fabrication through the use of a photoresist stripping plasma 40. Within the preferred embodiment of the present invention, the photoresist stripping plasma 40 preferably employs any oxygen containing etchant gas composition comprising an oxygen containing etchant gas selected from the group of oxygen containing etchant gases including but not limited to of oxygen, ozone, nitric oxide, nitrous oxide and water vapor. More preferably, the photoresist stripping plasma 40 employs an oxygen containing etchant gas composition comprising oxygen. Yet more preferably, the photoresist stripping plasma 40 employs an oxygen containing etchant gas composition comprising oxygen, water vapor and nitrogen.

Preferably, the photoresist stripping plasma 40 also employs: (1) a reactor chamber pressure of from about 0.05 to about 100 torr; (2) a radio frequency power of from about 100 to about 2500 watts at a radio frequency of 13.56 MHz; (3) a substrate 30 temperature of from about 150 to about 350 degrees centigrade; and (4) an oxygen flow rate of from about 250 to about 8000 standard cubic centimeters per minute (sccm), for a time period sufficient to completely strip from the microelectronics fabrication whose schematic cross-sectional diagram is illustrated in FIG. 5 the patterned photoresist layers 34a and 34b when forming the microelectronics fabrication whose schematic cross-sectional diagram is illustrated in FIG. 6.

As is illustrated within the schematic cross-sectional diagram of FIG. 6, the metal impregnated carbonaceous polymer residue layers 38a, 38b, 38c and 38d are not appreciably stripped from the microelectronics fabrication whose schematic cross-sectional diagram is illustrated in FIG. 5 incident to exposure to the photoresist stripping plasma 40, although the metal impregnated carbonaceous polymer residue layers 38a, 38b, 38c and 38d are oxidized within the photoresist stripping plasma 40 to form the oxidized metal impregnated polymer residue layers 38a', 38b', 38c' and 38d'.

Figure 7:
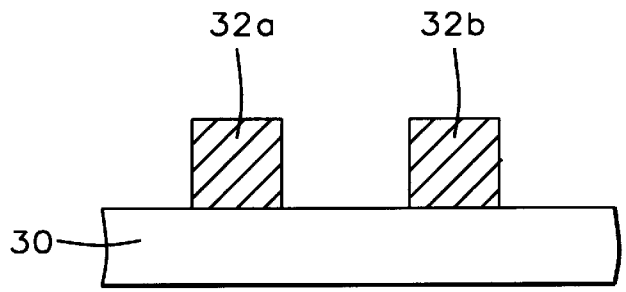

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein the oxidized metal impregnated polymer residue layers 38a', 38b', 38c' and 38d' have been stripped from the microelectronics fabrication.

Within the method of the present invention, the oxidized metal impregnated polymer residue layers 38a', 38b', 38c' and 38d' are stripped from the microelectronics fabrication whose schematic cross-sectional diagram is illustrated in FIG. 6 to provide the microelectronics fabrication whose schematic cross-sectional diagram is illustrated in FIG. 7 through use of an aqueous alkyl ammonium hydroxide based solution having incorporated therein a surfactant capable of forming an ordered monolayer upon the sidewalls of the patterned conductor metal layers 32a and 32b. Within the method of the present invention, the aqueous alkyl ammonium hydroxide based solution preferably employs an alkyl ammonium hydroxide material chosen from the group of alkyl ammonium hydroxide materials consisting of tetramethyl ammonium hydroxide (($CH_3$)$_4$$N^+OH^-$) (TMAH) materials, tetraethyl ammonium hydroxide (($C_2H_5$)$_4$$N^+OH^-$) (TEAH) materials, tetrapropyl ammonium hydroxide (($C_3H_7$)$_4$$N^+OH^-$) (TPAH) materials, tetrabutyl ammonium hydroxide (($C_4H_9$)$_4$$N^+OH^-$) materials and trimethyl (2-hydroxyethyl) ammonium hydroxide (($CH_3$)$_3$($C_2H_5OH$)$N^+OH^-$) (choline) materials.

With respect to the surfactant which is capable of forming the ordered monolayer adsorbed upon the sidewalls of the patterned conductor metal layers 32a and 32b, the surfactant is preferably selected from the group of surfactants consisting of: (1) fatty acid ($R_1COOH$) surfactants in accord with the general chemical structure as illustrated within FIG. 8a, where $R_1$ is an alkyl group ranging from about —$C_{16}H_{33}$ to about —$C_{22}H_{45}$; (2) 4,5-dialkyl-1,2 hexanediol surfactants in accord with the general chemical structure as illustrated within FIG. 8b, where each of $R_2$ and $R_3$ is an alkyl group ranging from about —$C_{16}H_{33}$ to about —$C_{22}H_{45}$; and (3) 2-hydroxy-5-dialkyl phenol surfactants in accord with the general chemical structure of FIG. 8c, where each of $R_4$ and $R_5$ is similarly also an alkyl group ranging from about —$C_{16}H_{33}$ to about —$C_{22}H_{45}$. Within each of the preceding groups of surfactants, the alkyl groups are preferably straight chain alkyl groups, although alkyl groups with some branching may also be employed within the method of the present invention.

Figure 8A:
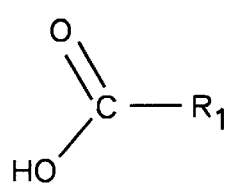
FIG. 8a, 8b, 9a, 9b, 10a and 10b show generic chemical structures of three types of surfactant molecules which may be employed within the method of the present invention, along with the structures of the surfactant molecules when ordered as monolayers upon a sidewall of a patterned aluminum containing metal layer.
Figure 8B:
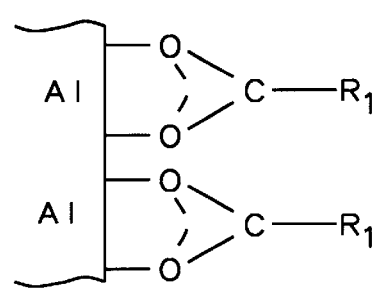
Figure 9A:
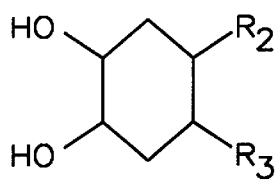
Figure 9B:
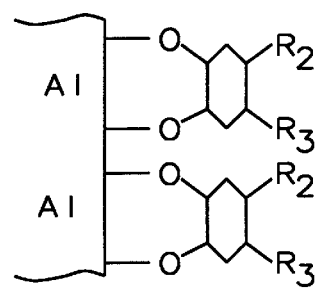
Figure 10A:
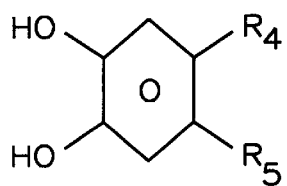
Figure 10B:
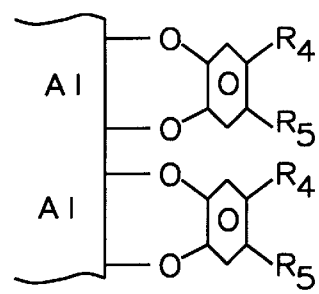

For illustrative purposes, ordered monolayers of the foregoing surfactant molecules upon the sidewall of an aluminum layer are illustrated in FIG. 8b, FIG. 9b and FIG. 10b which correspond, respectively, to the surfactant molecules as illustrated within FIG. 8a, FIG. 9a and FIG. 10a. As is understood by a person skilled in the art, the surfactant molecules as illustrated in FIG. 8a, FIG. 9a and FIG. 10a are operative as illustrated within FIG. 8b, FIG. 9b and FIG. 10b when the pertinent surfactant molecule is in its ionic form. Thus, the surfactant molecules in accord with the preferred embodiment of the present invention are chelating oxygen containing ionic, but not amphoteric, surfactants, preferably bidentate.

Preferably, the aqueous alkyl ammonium hydroxide based solution is employed at an alkyl ammonium hydroxide material concentration of from about 0.1 to about 10 weight percent and a surfactant concentration of from about 0.1 to about 10 weight percent. Preferably, the aqueous alkyl ammonium hydroxide based solution is also employed at a temperature of from about 20 to about 40 degrees centigrade, for a time period sufficient to completely strip from the microelectronics fabrication whose schematic cross-sectional diagram is illustrated in FIG. 6 the oxidized metal impregnated polymer residue layers 38a', 38b', 38c' and 38b' when forming the microelectronics fabrication whose schematic cross-sectional diagram is illustrated in FIG. 7. As is illustrated within the schematic cross-sectional diagram of FIG. 7, the oxidized metal impregnated polymer residue layers 38a', 38b', 38c' and 38d' are stripped from the patterned metal layers 32a and 32b with attenuated corrosion or erosion of the patterned metal layers 32a and 32b.

Thus, there is formed in accord with the preferred embodiment of the present invention a pair of patterned conductor metal layers within a microelectronics fabrication through a plasma etch method, where when stripping from the sidewalls of the patterned metal layers a series of oxidized metal impregnated polymer residue layers formed incident to the plasma etch method, the oxidized metal impregnated polymer residue layers being stripped through a wet chemical stripping method employing an aqueous alkyl ammonium hydroxide based solution, there is attenuated corrosion or erosion of the patterned metal layers.

As is understood by a person skilled in the art, the preferred embodiment of the present invention is illustrative of the present invention rather than limiting of the present invention. Revisions and modifications may be made to methods, materials, structures and dimensions through which is formed the pair of patterned metal layers in accord within the preferred embodiment of the present invention while still forming patterned metal layers in accord with the method of the present invention, as defined by the appended claims.

What is claimed is:

1. A method for forming a patterned metal layer within a microelectronics fabrication comprising:

providing a substrate employed within a microelectronics fabrication;

forming over the substrate a blanket metal layer;

forming over the blanket metal layer a patterned photoresist layer;

etching through use of a plasma etch method while employing the patterned photoresist layer as a photoresist etch mask layer the blanket metal layer to form a patterned metal layer, the patterned metal layer so formed having a metal impregnated carbonaceous polymer residue layer formed upon a sidewall of the patterned metal layer;

stripping from the patterned metal layer the patterned photoresist layer through use of an oxygen containing plasma while simultaneously oxidizing the metal impregnated carbonaceous polymer residue layer to form an oxidized metal impregnated polymer residue layer formed upon the sidewall of the patterned metal layer; and stripping from the sidewall of the patterned metal layer the oxidized metal impregnated polymer residue layer while employing an aqueous alkyl ammonium hydroxide based solution, the aqueous alkyl ammonium hydroxide based solution having incorporated therein a surfactant capable of forming a monolayer adsorbed upon the sidewall of the patterned metal layer.

2. The method of claim 1 wherein the oxidized metal impregnated polymer residue layer is stripped from upon the sidewall of the patterned metal layer with attenuated corrosion or erosion of the patterned metal layer in comparison with a method equivalent the method of claim 1, but employing an aqueous alkyl ammonium hydroxide based solution absent therein the surfactant capable of forming the monolayer adsorbed upon the sidewall of the patterned metal layer.

3. The method of claim 1 wherein the microelectronics fabrication is selected from the group of microelectronics fabrications consisting of integrated circuit microelectronics fabrications, solar cell microelectronics fabrications, ceramic substrate microelectronics fabrications and flat panel display microelectronics fabrications.

4. The method of claim 1 wherein the blanket metal layer is formed from a metal selected from the group of metals consisting of aluminum and aluminum alloys.

5. The method of claim 1 wherein aqueous alkyl ammonium hydroxide based solution is formed from an alkyl ammonium hydroxide material selected from the group of alkyl ammonium hydroxide materials consisting of tetramethyl ammonium hydroxide (TMAH) materials, tetraethyl ammonium hydroxide (TEAH) materials, tetrapropyl ammonium hydroxide (TPAH) materials, tetrabutyl ammonium hydroxide (TBAH) materials and choline materials.

6. The method of claim 1 wherein the surfactant is an ionic surfactant and the ionic surfactant is not amphoteric.

7. The method of claim 6 wherein the ionic surfactant is selected from the group of ionic surfactants consisting of:

alkyl carboxylic acid surfactants;

1,2-dihydroxy-4,5-dialkyl cyclohexane surfactants; and 2-hydroxy-4,5-dialkylphenol surfactants, wherein:

the alkyl groups within each of the foregoing surfactants range from about —$C_{16}H_{33}$ to about —$C_{22}H_{45}$.

8. A microelectronics fabrication having formed therein a patterned metal layer formed in accord with the method of claim 1.

9. A method for forming a patterned metal layer within an integrated circuit microelectronics fabrication comprising:

providing a semiconductor substrate;

forming over the semiconductor substrate a blanket metal layer;

forming over the blanket metal layer a patterned photoresist layer;

etching through use of a plasma etch method while employing the patterned photoresist layer as a photoresist etch mask layer the blanket metal layer to form a patterned metal layer, the patterned metal layer so formed having a metal impregnated carbonaceous polymer residue layer formed upon a sidewall of the patterned metal layer;

stripping from the patterned metal layer the patterned photoresist layer through use of an oxygen containing plasma while simultaneously oxidizing the metal impregnated carbonaceous polymer residue layer to form an oxidized metal impregnated polymer residue layer formed upon the sidewall of the patterned metal layer; and stripping from the sidewall of the patterned metal layer the oxidized metal impregnated polymer residue layer while employing an aqueous alkyl ammonium hydroxide based solution, the aqueous alkyl ammonium hydroxide based solution having incorporated therein a surfactant capable of forming a monolayer adsorbed upon the sidewall of the patterned metal layer.

10. The method of claim 9 wherein the oxidized metal impregnated polymer residue layer is stripped from upon the sidewall of the patterned metal layer with attenuated corrosion or erosion of the patterned metal layer in comparison a method equivalent to the method of claim 1, but employing an aqueous alkyl ammonium hydroxide based solution absent therein the surfactant capable of forming the monolayer adsorbed upon the sidewall of the patterned metal layer.

11. The method of claim 9 wherein the blanket metal layer is formed from a metal selected from the group of metals consisting of aluminum and aluminum alloys.

12. The method of claim 9 wherein aqueous alkyl ammonium hydroxide based solution is formed from an alkyl ammonium hydroxide material selected from the group of alkyl ammonium hydroxide materials consisting of tetramethyl ammonium hydroxide (TMAH) materials, tetraethyl ammonium hydroxide (TEAH) materials, tetrapropyl ammonium hydroxide (TPAH) materials, tetrabutyl ammonium hydroxide (TBAH) materials and choline materials.

13. The method of claim 9 wherein the surfactant is an ionic surfactant and the ionic surfactant is not amphoteric.

14. The method of claim 13 wherein the ionic surfactant is selected from the group of ionic surfactants consisting of:

alkyl carboxylic acid surfactants;

1,2-dihydroxy-4,5-dialkyl cyclohexane surfactants; and 2-hydroxy-4,5-dialkylphenol surfactants, wherein:

the alkyl groups within each of the foregoing surfactants range from about —$C_{16}H_{33}$ to about —$C_{22}H_{45}$.

15. An integrated circuit microelectronics fabrication having formed therein a patterned metal layer formed in accord with the method of claim 9.

* * * * *